(12) United States Patent
Yoon et al.

(10) Patent No.: US 11,044,808 B2
(45) Date of Patent: Jun. 22, 2021

(54) PRINTED CIRCUIT BOARD

(71) Applicant: SAMSUNG ELECTRO-MECHANICS CO., LTD., Suwon-si (KR)

(72) Inventors: Min Hee Yoon, Suwon-si (KR); Jong Eun Park, Suwon-si (KR); Sun Young Choi, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 16/736,114

(22) Filed: Jan. 7, 2020

(65) Prior Publication Data

US 2021/0127484 A1   Apr. 29, 2021

(30) Foreign Application Priority Data

Oct. 28, 2019   (KR) .................. 10-2019-0134291

(51) Int. Cl.
| | |
|---|---|
| *H05K 1/02* | (2006.01) |
| *H05K 1/11* | (2006.01) |
| *H05K 1/16* | (2006.01) |
| *H01L 23/00* | (2006.01) |
| *H01L 23/12* | (2006.01) |
| *H01L 23/31* | (2006.01) |
| *H01L 23/48* | (2006.01) |
| *H01L 23/52* | (2006.01) |
| *H01L 23/498* | (2006.01) |

(52) U.S. Cl.
CPC ..... *H05K 1/0271* (2013.01); *H01L 23/49838* (2013.01); *H01L 23/49816* (2013.01); *H05K 2201/09781* (2013.01); *H05K 2201/09972* (2013.01)

(58) Field of Classification Search
CPC ... H05K 1/02; H05K 1/11; H05K 1/16; H01L 23/00; H01L 23/12; H01L 23/31; H01L 23/48; H01L 23/52; H01L 23/498
USPC .............. 174/262, 251, 260, 261, 264, 266; 257/668, 738, 774, 778; 361/303
See application file for complete search history.

(56) References Cited

U.S. PATENT DOCUMENTS 6,399,897 B1 * 6/2002 Umematsu ........ H01L 23/49822
174/261
2007/0047175 A1 * 3/2007 Sato ...................... H01G 4/232
361/303

(Continued)

FOREIGN PATENT DOCUMENTS

| JP | 2017-152448 A | 8/2017 |
|---|---|---|
| KR | 10-1009107 B1 | 1/2011 |
| KR | 10-1059630 B1 | 8/2011 |

*Primary Examiner* — Xiaoliang Chen
(74) *Attorney, Agent, or Firm* — Morgan, Lewis & Bockius LLP

(57) ABSTRACT

A printed circuit board includes a core layer, a plurality of conductive pattern layers disposed on one side and the other side of the core layer, a plurality of insulating layers disposed on the one side and the other side of the core layer, and a plurality of via layers disposed on the one side and the other side of the core layer. The printed circuit board has a wiring region and a dummy region surrounding at least a portion outside of the wiring region on a plane. A metal ratio in the dummy region on one side and a metal ratio in the dummy region on the other side are different from each other.

17 Claims, 5 Drawing Sheets

(56) References Cited

U.S. PATENT DOCUMENTS

| | | | |
|---|---|---|---|
| 2007/0175657 A1* | 8/2007 | Itoh | H05K 1/0271 |
| | | | 174/260 |
| 2009/0001573 A1* | 1/2009 | Jirawongsapiwat | ......................... |
| | | | H01L 23/49838 |
| | | | 257/738 |
| 2010/0264549 A1* | 10/2010 | Ko | H05K 3/465 |
| | | | 257/774 |
| 2012/0077333 A1* | 3/2012 | Ko | H01L 23/49811 |
| | | | 438/460 |
| 2013/0199833 A1* | 8/2013 | Park | H05K 1/115 |
| | | | 174/264 |
| 2015/0245473 A1* | 8/2015 | Shimizu | H05K 1/036 |
| | | | 257/778 |
| 2016/0181195 A1* | 6/2016 | Kim | H01L 23/3121 |
| | | | 257/668 |
| 2016/0360609 A1* | 12/2016 | Lee | H05K 3/4682 |
| 2017/0005100 A1* | 1/2017 | Cho | H01L 23/522 |
| 2017/0047296 A1* | 2/2017 | Watanabe | H01L 23/31 |
| 2018/0366382 A1* | 12/2018 | Yokozawa | H05K 3/425 |

* cited by examiner

I-I'

II-II'

PRINTED CIRCUIT BOARD

CROSS-REFERENCE TO RELATED APPLICATION(S)

This application claims benefit of priority to Korean Patent Application No. 10-2019-0134291 filed on Oct. 28, 2019 in the Korean Intellectual Property Office, the disclosure of which is incorporated herein by reference in its entirety.

TECHNICAL FIELD

The present disclosure relates to a printed circuit board.

BACKGROUND

With a rapid increase in the number of I/Os and integration due to high performance of electronic products, high-layering and large-sized technologies are required in a substrate. Accordingly, a bending property of the substrate has also emerged as an important characteristic due to high-layering to satisfy technical requirements, and by controlling it, there is a continuous demand for improving an assembly process. Accordingly, there is demand for a substrate structure capable of securing a yield while manufacturing a high-layer substrate.

SUMMARY

An aspect of the present disclosure is to provide a printed circuit board that can secure a yield of an assembly process through warpage control of a substrate.

According to an aspect of the present disclosure, a dummy pattern and/or a dummy via for warpage control in a dummy region of the substrate is formed, a metal ratio is configured to be different in the dummy region on both sides based on a core, such that an average value, a value for each position, a shape, and the like of warpage of a substrate may be controlled to respond to an issue on the assembly.

For example, a printed circuit board according to an embodiment proposed in the present disclosure includes a core layer, a plurality of pattern layers disposed on one side and the other side of the core layer, a plurality of insulating layers disposed on the one side and the other side of the core layer, and a plurality of via layers disposed on the one side and the other side of the core layer. The printed circuit board has a wiring region and a dummy region surrounding at least a portion outside of the wiring region on a plane. A metal ratio in the dummy region on one side and a metal ratio in the dummy region on the other side are different from each other.

A printed circuit board according to an embodiment proposed in the present disclosure includes a core layer; first conductive pattern layers and first insulating layers alternately disposed on one side of the core layer; and second conductive pattern layers and second insulating layers alternately disposed on the other side of the core layer. The printed circuit board has a wiring region and a dummy region surrounding at least a portion outside of the wiring region. The first conductive pattern layers include first dummy patterns disposed in the dummy region and exposed from a side surface of the printed circuit board. The second conductive pattern layers include second dummy patterns disposed in the dummy region and exposed from the side surface of the printed circuit board.

A printed circuit board according to an embodiment proposed in the present disclosure includes a core layer; conductive pattern layers and insulating layers alternately disposed on one side of the core layer. The printed circuit board has a wiring region and a dummy region surrounding at least a portion outside of the wiring region. The conductive pattern layers include dummy patterns disposed in the dummy region and exposed from a side surface of the printed circuit board. The dummy patterns are electrically insulated from at least signal patterns of the conductive pattern layers. A thickness of each of the insulating layers is less than a thickness of the core layer.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
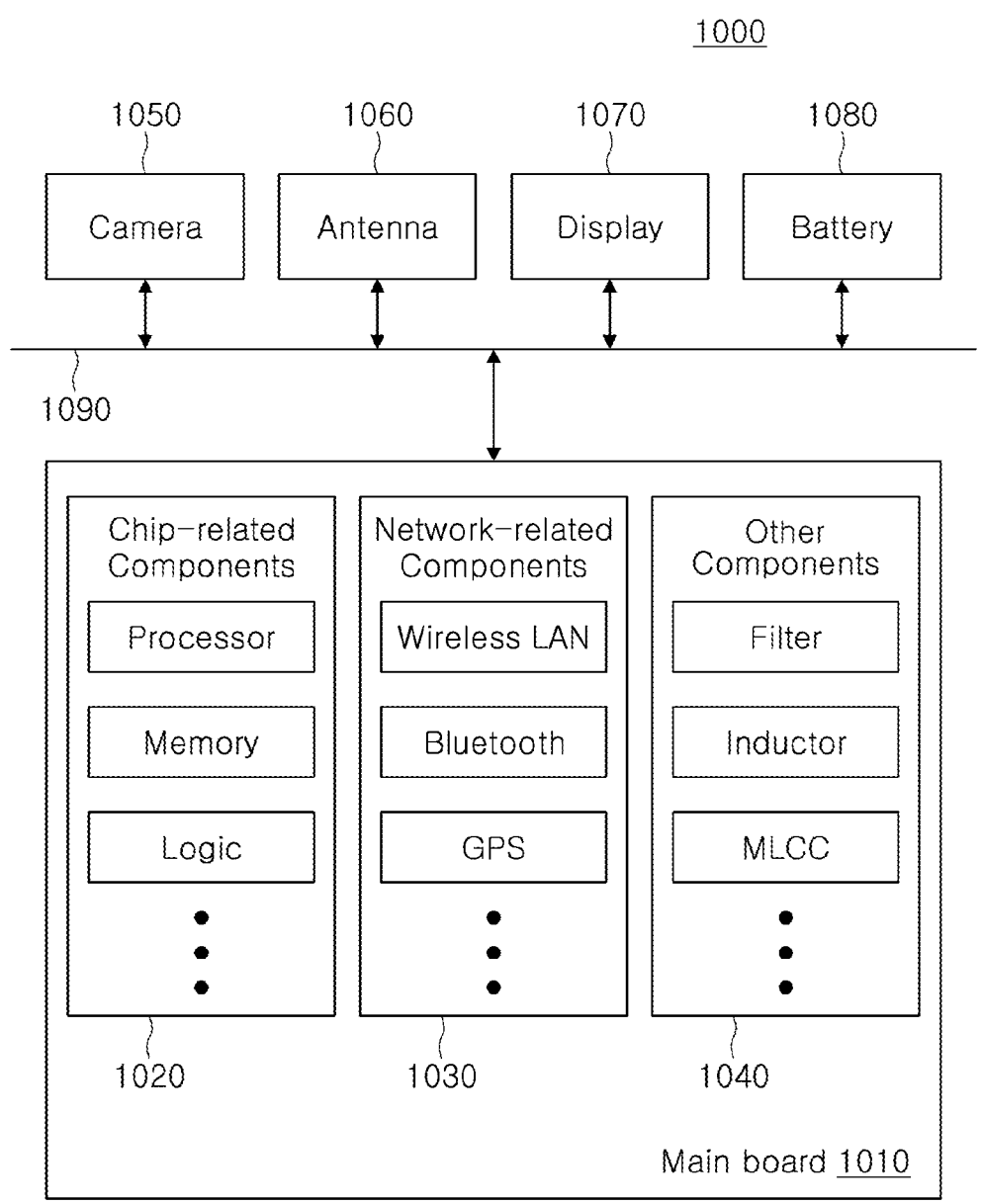
FIG. 1 is a schematic block diagram illustrating an example of an electronic system.

Hereinafter, the present disclosure will be described with reference to the accompanying drawings. Shapes and dimensions of the elements in the drawings may be exaggerated or reduced for greater clarity of description.

Electronic Device

FIG. 1 is a schematic block diagram illustrating an example of an electronic system.

Referring to FIG. 1, an electronic device 1000 may accommodate a main board 1010. The main board 1010 may include chip related components 1020, network related components 1030, other components 1040, or the like, physically or electrically connected thereto. These components may be connected to others to be described below to form various signal lines 1090.

The chip associated components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like, or the like. However, the chip associated components 1020 are not limited thereto, and may include other types of chip associated components. In addition, the chip-associated components 1020 may be combined with each other.

The network associated components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth®, 3G, 4G, and 5G protocols, and any other wireless and wired protocols, designated after the abovementioned protocols. However, the network associated components 1030 are not limited thereto, and may also include a variety of other wireless or wired standards or protocols. In addition, the network associated components 1030 may be combined with each other, together with the chip associated components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip related components 1020 or the network related components 1030 described above.

Depending on a type of the electronic device 1000, the electronic device 1000 includes other components that may or may not be physically or electrically connected to the main board 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

Figure 2:
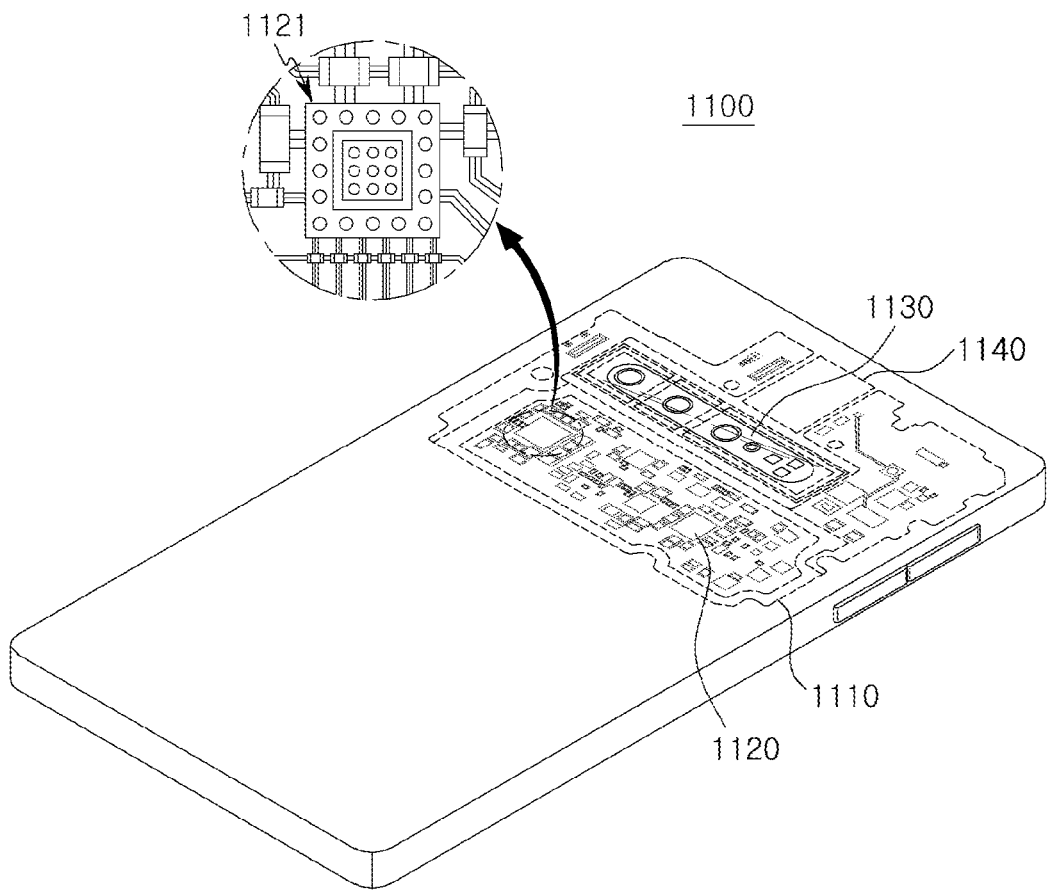
FIG. 2 is a schematic perspective view illustrating an example of an electronic device.

FIG. 2 is a schematic perspective view illustrating an example of an electronic device.

Referring to FIG. 2, an electronic device may be, for example, a smartphone 1100. A mainboard 1110 may be accommodated in the smartphone 1100, and various electronic components 1120 may be physically and/or electrically connected to the mainboard 1110. In addition, other components that may or may not be physically or electrically connected to the printed circuit board 1110, such as a camera module 1130 and/or a speaker 1140, may be accommodated in the mainboard 1110. A portion of the electronic components 1120 may be chip related components, for example, a semiconductor package 1121, but are not limited thereto. The semiconductor package 1121 may be a surface mounted type, such as a semiconductor chip or a passive component on a package board of a multilayer printed circuit board, but is not limited thereto. Meanwhile, the electronic device is not necessarily limited to the smartphone 1100, but may be other electronic devices as described above.

Printed Circuit Board

Figure 3:
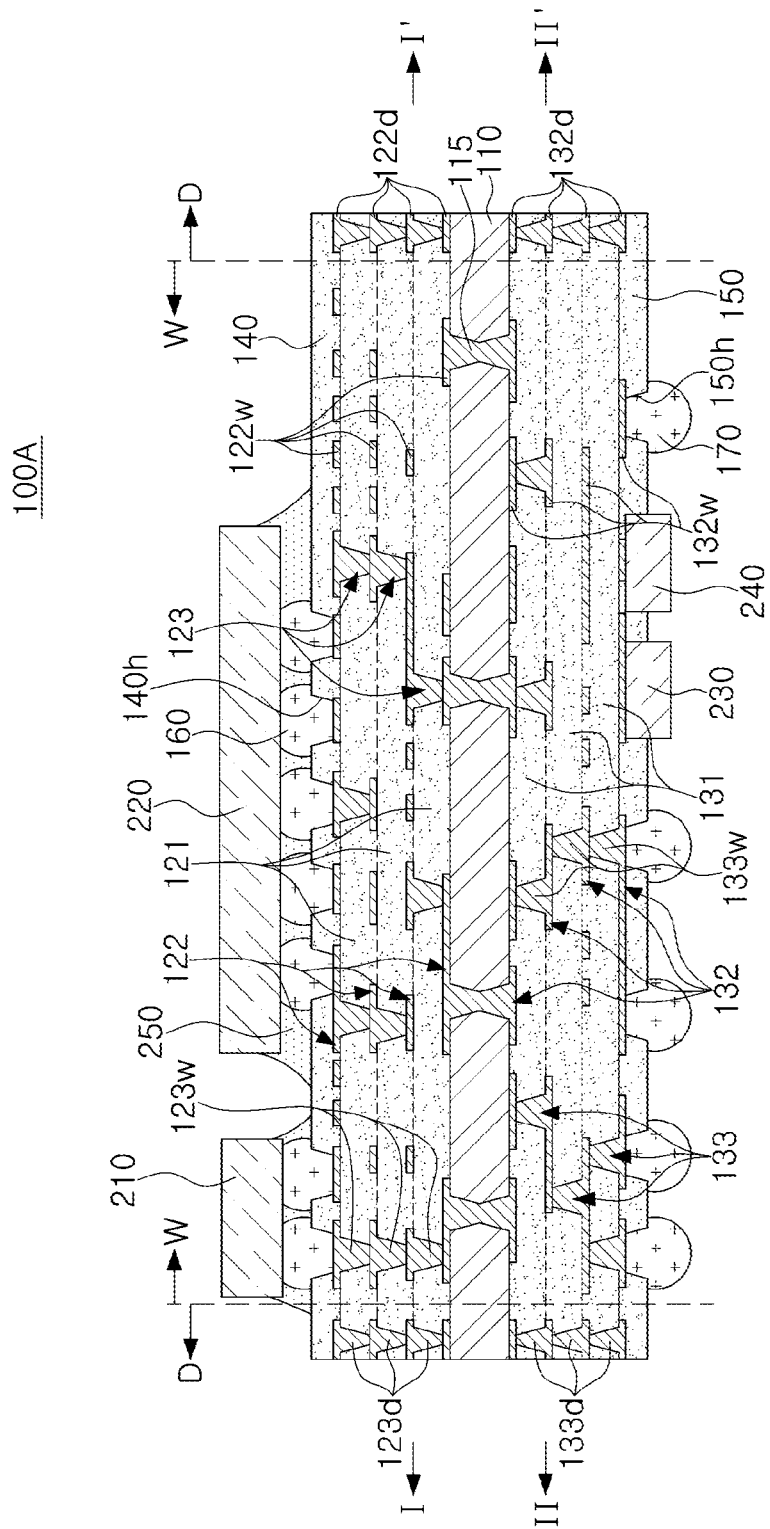
FIG. 3 is a schematic cross-sectional view illustrating an example of a printed circuit board.

FIG. 3 is a schematic cross-sectional view illustrating an example of a printed circuit board.

Figure 4:
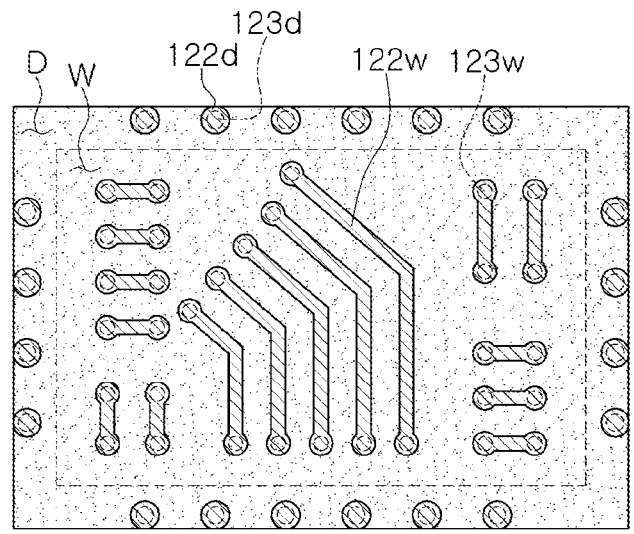
FIG. 4 is a schematic plan view taken along line I-I' of the printed circuit board of FIG. 3.

FIG. 4 is a schematic plan view taken along line I-I' of the printed circuit board of FIG. 3.

Figure 5:
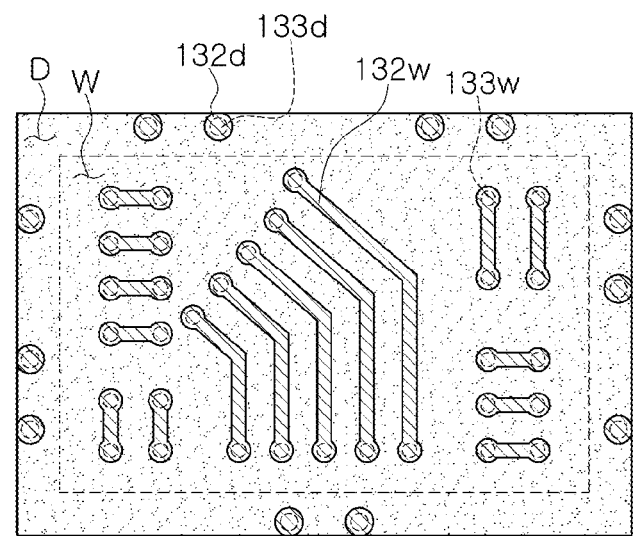
FIG. 5 is a schematic plan view taken along line II-II' of the printed circuit board of FIG. 3.

FIG. 5 is a schematic plan view taken along line II-II' of the printed circuit board of FIG. 3.

Referring to the drawings, a printed circuit board 100A according to an example is configured such that a plurality of first pattern layers 122, a plurality of first insulating layers 121, and a plurality of first via layers 123 are disposed on an upper side of a core layer 110. The plurality of first pattern layers 122 and the plurality of first insulating layers 121 may be alternately stacked in a thickness direction. The plurality of first via layers 123 may penetrate through the plurality of first insulating layers 121, respectively, and may connect the plurality of first pattern layers 122 vertically. In addition, the printed circuit board 100A according to an example is configured such that a plurality of second pattern layers 132, a plurality of second insulating layers 131, and a plurality of second via layers 133 are disposed on a lower side of the core layer 110. The plurality of second pattern layers 132 and the plurality of second insulating layers 131 may be alternately stacked in a thickness direction. The plurality of second via layers 133 may penetrate through the plurality of second insulating layers 131, respectively, and may connect the plurality of pattern layers 132 vertically. As such, the printed circuit board 100A according to an example may be a high-layered substrate.

Meanwhile, as described above, in recent years, with a rapid increase in the number of I/Os and integration according to high performance of electronic components, high-layered and large-sized technologies are required in the substrate. Accordingly, as the high-layering to satisfy the technical demands, the bending property of the substrate is also emerging as an important characteristic, and by controlling this, there is a continuous demand for improving the assembly process. In order to improve this, it may be considered to proceed an improvement through a simulation at the time of design such as a plating thickness, an insulator thickness, a plating area, and the like when manufacturing the substrate, but due to design limitations, there are limitations to a breakthrough improvement. In order to compensate for this, it may be considered to add a process in a substrate process for applying heat and making a correction, but which also has limitations to perfectly control warpage, and another issue may occur due to deformation during the heating process.

On the other hand, the printed circuit board 100A according to an example has a wiring region W and a dummy region D surrounding at least a portion outside of the wiring region W on a plane, and in this case, a metal ratio in the upper dummy region D and a metal ratio in the other dummy region D are different from each other, based on the core layer 110. Here, the metal ratios are different from each other, which means, for example, an amount of metal (or an area occupied by metal) in the upper dummy region D and an amount of metal in the lower dummy region D (or an area occupied by metal) are different from each other. For example, the substrate is designed to further have a dummy region D in addition to a wiring region W, and in this case, dummy patterns 122d and 132d and/or dummy vias 123d and 133d are formed in the dummy region D. However, the warpage of the substrate may be controlled by varying the number of the upper dummy pattern 122d and/or the dummy via 123d and the number of the lower dummy pattern 132d and/or the dummy via 133d. In this case, an average value, a value for each position, a shape, and the like, of the warpage of the substrate may be controlled, and as a result, specific warpage may be realized in a desired direction. Therefore, a yield in an assembly process may be improved. As a non-limited example, the dummy patterns 122d and 132d and/or the dummy vias 123d and 133d may be designed such that the metal ratio in the upper dummy region D is greater than the metal ratio in the other dummy region D, based on the core layer 110, and the substrate may have sad-shaped warpage, thereby improving the yield in the assembly process.

Meanwhile, the printed circuit board 100A may include a first wiring pattern 122w in which the plurality of first pattern layers 122 are disposed in the wiring region W and a first dummy pattern 122d in which the plurality of first pattern layers 122 are disposed in the dummy region D, respectively. In addition, the printed circuit board 100A may include may include a second wiring pattern 132w in which the plurality of second pattern layers 132 are disposed in the wiring region W and a second dummy pattern 132d in which the plurality of second pattern layers 132 are disposed in the dummy region D, respectively. In this case, as shown in FIG. 4, the number of the first dummy pattern 122d included in any one of the plurality of first pattern layers 122 and disposed on the same level as each other may be different from the number of the second dummy pattern 132d included in any one of the plurality of second pattern layers and disposed on the same level each other, as shown in FIG. 5. The first dummy pattern 122d and the second dummy pattern 132d may be disposed at symmetrical positions based on the core layer 110, but is not limited thereto. For example, the number of the first dummy pattern 122d included in any one of the plurality of first pattern layers 122 and disposed on the same level as each other may be greater than the number of the second dummy pattern 132d included in any one of the plurality of second pattern layers 132 and disposed on the same level as each other, or may be vice versa. As a result, the total number of the first dummy pattern 122d and the total number of the second dummy pattern 132d may be different from each other. In addition, the other part of the dummy region D may have the same upper side and lower side, but is not limited thereto, and there may be some differences between the upper side and the lower side in other parts. In any case, the total number of the first dummy pattern 122d and the total number of the second dummy pattern 132d may be different from each other, as a result of the disposition of FIGS. 4 and 5 as described above, and thus, based on the core layer 110, the metal ratio in the upper dummy region D by the metal included in the first dummy pattern 122d and the metal ratio in the lower dummy region D by the metal included in the second dummy pattern 132d may be different from each other.

In addition, the printed circuit board 100A according to an example may include a first wiring via 123w in which the plurality of first via layers 123 are disposed in the wiring region W and a first dummy via 123d in which the plurality of first via layers 123 are disposed in the dummy region D, respectively. In addition, the printed circuit board 100A may include a second wiring via 133w in which the plurality of second via layers 133 are disposed in the wiring region W and a second dummy via 133d in which the plurality of second via layers 133 are disposed in the dummy region D, respectively. In this case, as shown in FIG. 4, the number of the first dummy via 123d included in any one of the plurality of first via layers 123 and disposed on the same level as each other may be different from the number of the second dummy via 133d included in any one of the plurality of second via layers 133 and disposed on the same level as each other, as shown in FIG. 5. The first dummy via 123d and the second dummy via 133d may be disposed at symmetrical positions based on the core layer 110, but is not limited thereto. For example, the number of the first dummy via 123d included in any one of the plurality of first via layers 123 and disposed on the same level as each other may be greater than the number of the second dummy via 133d included in any one of the plurality of second via layers 133 and disposed on the same level as each other, or may be a vice versa. As a result, the total number of the first dummy via 123d and the total number of the second dummy via 133d may be different from each other. In addition, the other part of the dummy region D may have the same upper side and lower side, but is not limited thereto, and there may have some differences between the upper side and the lower side in other parts. In any case, as a result of the disposition of FIGS. 4 and 5, as described above, the total number of the first dummy via 123d and the total number of the second dummy via 123d may be different from each other, and thus, based on the core layer 110, the metal ratio in the upper dummy region D by the metal included in the first dummy via 123d and the metal ratio in the lower dummy region D by the metal included in the second dummy via 133d may be different from each other.

Hereinafter, components of the printed circuit board 100A according to an example will be described in more detail with reference to the accompanying drawings.

The core layer 110 may be a core substrate, which is a center of the printed circuit board 100A. An insulating material may be used as a material of the core layer 110. In this case, as the insulating material, a thermosetting resin such as an epoxy resin, a thermoplastic resin such as polyimide, or a material including a reinforcing material such as glass fiber (or glass cloth, glass fabric) and/or an inorganic filler, for example, a copper clad laminate (CCL), an unclad CCL, or the like may be used, but is not limited thereto. A metal plate or a glass plate may be used as the core layer 110, and a ceramic plate may also be used. If necessary, a liquid crystal polymer (LCP) may be used as the material of the core layer 110. The core layer 110 may be thicker than thicknesses of each of the insulating layers 121 and 131 for the purpose of warpage control, and the like. In addition, the core layer 110 may be superior in terms of rigidity to each of the insulating layers 121 and 133 for the purpose of warpage control, and the like. For example, the core layer 110 may have a greater elastic modulus than each of the insulating layers 121 and 131.

The insulating layers 121 and 131 may provide insulating regions for forming multilayer wirings on both sides of the core layer 110. An insulating material may be used as a material of the insulating layers 121 and 131. In this case, as the insulating material, a thermosetting resin such as an epoxy resin, a thermoplastic resin such as polyimide, or a material including a reinforcing material such as an inorganic filler together with the above resin materials, for example, prepreg, an Ajinomoto Build-up Film (ABF) may be used. If necessary, and a Photo-Imageable Dielectric (PID) may be used as the material of the insulating layers 121 and 131. Meanwhile, the insulating layers 121 and 131 may include the same material as each other, or may include different materials from each other. Boundaries of the insulating layers 121 and 131 may be clear or unclear.

A metal material may be used as a material of the pattern layers 122 and 132. In this case, as the metal material, copper (Cu), aluminum (Al), silver (Ag), tin (Sn), gold (Au), nickel (Ni), lead (Pb), titanium (Ti), alloys thereof, or the like may be used. The pattern layers 122 and 132 may be formed by using a plating process such as an additive process (AP), a semi AP (SAP), a modified SAP (MASP), tenting (TT), or the like, respectively. As a result, the pattern layers 122 and 132 may include a seed layer, which is an electroless plating layer and an electrolytic plating layer formed based on the seed layer, respectively. The pattern layers 122 and 132 may include wiring patterns 122w and 132w disposed in the wiring region W and dummy patterns 122d and 132d disposed in the dummy region D. The wiring patterns 122w and 132w may perform various functions depending on designs of corresponding layers. For example, the wiring patterns 122w and 132w may include a ground pattern, a power pattern, a signal pattern, and the like. Here, the signal pattern includes various signals except for the ground pattern, the power pattern, and the like, such as, a data signal. These patterns may include a line pattern, a plane pattern, and/or a pad pattern. The dummy patterns 122d and 132d are for warpage control, and may be electrically insulated from at least the signal pattern among the wiring patterns 122w and 132w. If necessary, the dummy patterns 122d and 132d may be electrically connected to the ground pattern and/or the power pattern among the wiring patterns 122w and 132w, but are not limited thereto, and may be electrically insulated from the ground pattern and/or the power pattern. At least a portion of each of the dummy patterns 122d and 132d may be exposed to a side surface of the substrate, but is not limited thereto, and may not be exposed.

A metal material may also be used as a material of the via layers 123 and 133, and in this case, as the metal material, aluminum (Al), silver (Ag), tin (Sn), gold (Au), or nickel (Ni), lead (Pb), titanium (Ti), alloys thereof, or the like may be used. The via layers 123 and 133 may be formed by using a plating process such as AP, SAP, MSAP, and TT, respectively, and as a result, the via layers 123 and 133 may include a seed layer, which is an electroless plating layer, and an electrolytic plating layer formed based on the seed layer, respectively. The via layers 123 and 133 may include wiring vias 123w and 133w disposed in the wiring region W and dummy vias 123d and 133d disposed in the dummy region D. The wiring vias 123w and 133w may vertically connect the wiring patterns 122w and 132w disposed on the different levels. The dummy vias 123d and 133d may connect the dummy patterns 122d and 132d disposed on the different levels vertically. The wiring vias 123w and 133w may also perform various functions due to designs of corresponding layers. For example, the wiring vias 122w and 133w may include a wiring via for a signal connection, a wiring via for a ground connection, a wiring via for a power connection, and the like. The dummy vias 123d and 133d are for warpage control, and may be electrically insulated from at least a signal pattern among the wiring patterns 122w and 132w. If necessary, the dummy patterns 122d and 132d may be electrically connected to the ground pattern and/or the power patter among the wiring patterns 122w and 132w, but are not limited thereto, and may be electrically insulated from the ground pattern and/or the power pattern. The wiring vias 123w and 133w and the dummy vias 123d and 133d may be completely filled with a metal material, respectively, or the metal material may be formed along a wall surface of a via hole. In addition, all known shapes in the art such as a tapered shape may be applied.

The through via 115 penetrates through the core layer 110 and connects the wiring patterns 122w and 132w among the pattern layers 122 and 132 disposed on the upper and lower surfaces of the core layer 110, respectively. A metal material may also be used as a material of the through via 115, and in this case, as the metal material, copper (Cu), aluminum (Al), silver (Ag), tin (Sn), gold (Au), nickel (Ni), lead (Pb), titanium (Ti), alloys thereof, or the like may be used. The through via 115 may also be formed by using a plating process such as AP, SAP, MSAP, and TT, and the like, respectively, and as a result, may include a seed layer, which is an electroless plating layer, and an electrolytic plating layer formed based on the seed layer. The through via 115 may be disposed in the wiring region W. The through via 115 may include a through via for a signal connection, a through via for a ground connection, a through via for a power connection, and the like. The through via 115 may have a cylindrical shape, an hourglass shape, or the like.

The passivation layers 140 and 150 is an additional configuration for protecting an internal configuration of the printed circuit board 100A from external physical and chemical damages. The passivation layers 140 and 150 may include a thermosetting resin, respectively. For example, the passivation layers 140 and 150 may be ABFs, respectively. However, the present disclosure is not limited thereto, and each of the passivation layers 140 and 150 may be a known solder resist (SR) layer, respectively. In addition, if necessary, a PID may be included. The passivation layers 140 and 150 may have a plurality of openings 140h and 150h, respectively, and the plurality of openings 140h and 150h may expose at least a portion of each of the wiring patterns 122w and 132w disposed at an uppermost side and a lowermost side of the wiring patterns 122w and 132w from the passivation layers 140 and 150. Meanwhile, a surface treatment layer may be formed on the surfaces of the exposed wiring patterns 122w and 132w. The surface treatment layer may be, formed by, for example, electrolytic gold plating, electroless gold plating, organic solderability preservative (OSP) or electroless tin plating, electroless silver plating, electroless nickel plating/substituting plating, direct immersion gold (DIG) plating, hot air solder leveling (HASL), or the like. If necessary, each of the openings 140h and 150h may be composed of a plurality of via holes. If necessary, an under bump metal (UBM) may be disposed on each of the openings 140h and 150h in order to improve reliability.

The electrical connection metals 160 and 170 are an additional configuration that can physically and/or electrically connect the printed circuit board 100A to an outside. For example, electronic components 210 and 220 may be mounted on the printed circuit board 100A according to an example through a first electrical connection metal 160. In addition, the printed circuit board 100A according to an example may be mounted on the other substrate such as a mainboard of the electronic device through a second electrical connection metal 170. For example, the printed circuit board 100A according to an example a package substrate of a ball grid array (BGA) type. The electrical connection metals 160 and 170 may be disposed on the plurality of openings 140h and 150h of the passivation layers 140 and 150, respectively. The electrical connection metals 160 and 170 may be composed of a low melting point metal having a lower melting point than copper (Cu), respectively, for example, tin (Sn) or an alloy containing tin (Sn). For example, the electrical connection metals 160 and 170 may be formed of solder, but this is merely an example, and a material thereof is not limited thereto.

The electrical connection metals 160 and 170 may be lands, balls, pins, or the like. The electrical connection metals 160 and 170 may be formed as multilayer structures or single layer structures. When the electrical connection metals 160 and 170 are formed of multilayer structures, the electrical connection metals 160 and 170 may include a copper pillar and a solder. When the electrical connection metals 160 and 170 are formed of a single layer, the electrical connection metals 160 and 170 may include a tin-silver solder, but this is merely an example, but the present disclosure is not limited thereto. The number, an interval, a dispositional form, and the like, of the electrical connection metals 160 and 170 are not particularly limited, but may be sufficiently modified depending on design particulars by those skilled in the art. The second electrical connection metal 170 may be for being mounted on the mainboard, and thus the number of the second electrical connection metal 170 may be greater than the number of the first electrical connection metal 150, and the size of the second electrical connection metal 170 may be greater than the size of the first electrical connection metal 150. In this regard, the number of the plurality of second openings 140$h$ may be greater than the number of the plurality of first openings 130$h$, and the size of the plurality of second openings 140$h$ may be greater than the size of the plurality of first openings 130$h$.

The electronic components 210 and 220 may be surface mounted on the upper side of the printed circuit board 100A according to an example using the first electric connection metal 160. The electronic components 210 and 220 may be known active components or passive components, respectively. For example, the electronic components 210 and 220 may be a semiconductor chip or a semiconductor package including a semiconductor chip, respectively. Alternatively, the electronic components 210 and 220 may be a passive component in a form of a chip, respectively, for example, a capacitor in a form of a chip, an inductor in a form of a chip, or the like. However, the present disclosure is not limited thereto, and they may be other known surface mounting components. The electronic components 210 and 220 may be fixed using an underfill 250. Similarly, electronic components 230 and 240 may also be surface mounted on a lower side of a printed circuit board 100B according to an example using an electrical connection metal, or the like. The electronic components 230 and 240 may also be known active components or passive components described above. However, the present disclosure is not limited thereto, and may be other known surface mounting components.

Figure 6:
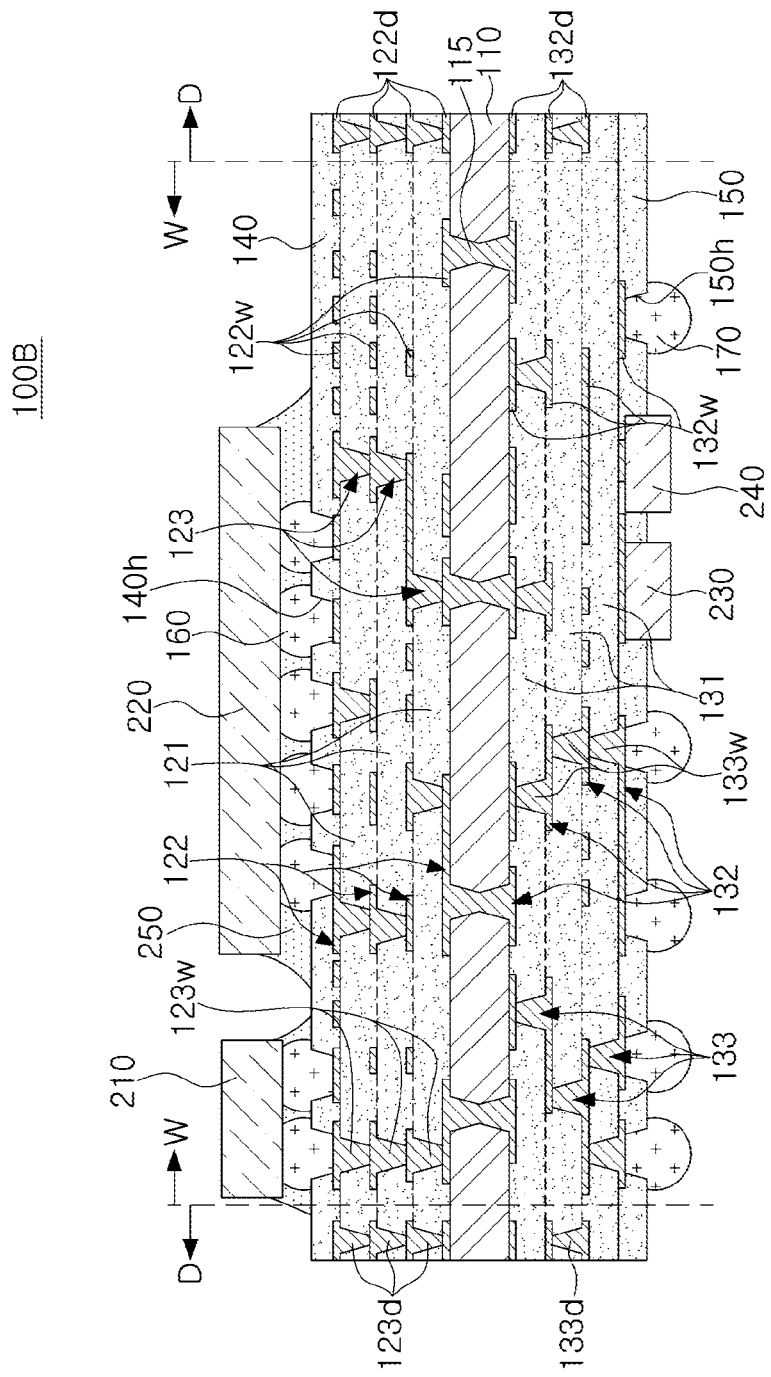
FIG. 6 is a schematic cross-sectional view illustrating another example of a printed circuit board.

FIG. 6 is a schematic cross-sectional view illustrating another example of a printed circuit board.

Referring to FIG. 6, the printed circuit board 100B according to another example also has a wiring region W and a dummy region D surrounding at least a portion outside of the wiring region W on a plane, and in this case, a metal ratio in the upper dummy region D and a metal ratio in the other dummy region are different from each other, based on the core layer 110. Therefore, it is possible to control an average value, a value for each position, a shape, and the like, of the warpage of the substrate, and as a result, it is possible to implement specific warpage in a desired direction. Therefore, similar to this, a yield in an assembly process may be improved.

Meanwhile, the printed circuit board 100B according to another example may include a first wiring pattern 122$w$ in which the plurality of first pattern layers 122 are disposed in the wiring region W, and a first dummy pattern 122$d$ in which one or more thereof are disposed in the dummy region D, respectively. In addition, the printed circuit board 100B according to another embodiment may include a second wiring pattern 132$w$ in which the plurality of second pattern layers 132 are disposed in the wiring region W, and a second dummy pattern 132$d$ in which one or more thereof are disposed in the dummy region D, respectively. In this case, the number of layers of the first pattern layer 122 including the first dummy pattern 122$d$ and the number of layers of the second pattern layer 132 including the second dummy pattern 132$d$ may be different from each other. For example, the number of layers of the first pattern layer 122 including the first dummy pattern 122$d$ may be greater than the number of layers of the second patter layer 132 including the second dummy pattern 132$d$, or vice versa. As a result, the total number of the first dummy pattern 122$d$ and the total number of the second dummy pattern 132$d$ may be different from each other. In addition, the other parts of the dummy region D may have the same upper side and the lower side, but the present disclosure is not limited thereto, and there may be some differences between the upper side and the lower side in other parts. In any case, as a result of the above-described disposition, the total number of the first dummy pattern 122$d$ and the total number of the second dummy pattern 132$d$ may be different from each other. Therefore, the metal ratio in the upper dummy region D by the metal included in the first dummy pattern 122$d$ and the metal ratio in the lower dummy region D by the metal included in the second dummy pattern 132$d$, based on the core layer 110, may be different from each other.

In addition, the printed circuit board 100B according to another example may include a first wiring via 123$w$ in which the plurality of first via layers 123 are disposed in the wiring region W, and a first dummy via 123$d$ in which one or more thereof are disposed in the dummy region D, respectively. In addition, the printed circuit board 100B according to another example may include a second wiring via 133$w$ in which the plurality of second via layers 133 are disposed in the wiring region W, and a second dummy via 133$d$ in which one or more thereof are disposed in the dummy region D, respectively. In this case, the number of layers of the first via layer 123 including the first dummy via 123$d$ and the number of layers of the second via layer 133 including the second dummy via 133$d$ may be different from each other. For example, the number of layers of the first via layer 123 including the first dummy via 123$d$ may be greater than the number of layers of the second via layer 133 including the second dummy via 133$d$, or may be vice versa. As a result, the total number of the first dummy via 123$d$ and the total number of the second dummy via 133$d$ may be different from each other. In addition, the other parts of the dummy region D may have the same upper side and the lower side, but the present disclosure is not limited thereto, and there may be some differences between the upper side and the lower side in other parts. In any case, as a result of the above-described disposition, the total number of the first dummy via 123$d$ and the total number of the second dummy via 133$d$ may be different from each other, and thus, the metal ratio in the upper dummy region D by the metal included in the first dummy via 123$d$ and the metal ratio in the lower dummy region D by the metal included in the second dummy via 133$d$, based on the core layer 110, may be different from each other.

Meanwhile, the disposition of the dummy patterns 122$d$ and 132$d$ and/or the dummy vias 123$d$ and 133$d$ in the dummy region D of the printed circuit board 100A according to the above-described example may be combined with the disposition of the dummy patterns 122d and 132d and/or the dummy vias 123d and 133d in the dummy region D in the printed circuit board 100B according to another example described above.

Other parts are substantially the same as those described in the printed circuit board 100A according to the above-described example, and thus, detailed descriptions thereof will be omitted.

As set forth above, a printed circuit board capable of securing a yield of an assembly process may be provided through a warpage control of a substrate.

As used herein, the terms "side portion," "side surface," and the like, are used to refer to a direction toward a first or second direction or a surface on said direction. The terms "upper side," "upper portion", "upper surface," and the like, are used to refer to a direction toward a third direction or a surface on said direction, while the terms "lower side," "lower portion," "lower surface," and the like, are used to refer to a direction opposite to the direction toward the third direction or a surface on said direction. In addition, said spatially relative terms have been used as a concept including a case in which a target component is positioned in a corresponding direction, but does not directly contact a reference component, as well as a case in which the target component directly contacts the reference component in the corresponding direction. However, the terms may be defined as above for ease of description, and the scope of right of the exemplary embodiments is not particularly limited to the above terms.

As used herein, the term "connected" may not only refer to "directly connected" but also include "indirectly connected" by means of an adhesive layer, or the like. The term "electrically connected" may include both of the case in which constitutional elements are "physically connected" and the case in which constitutional elements are "not physically connected." Further, the terms "first," "second," and the like may be used to distinguish one constitutional element from the other, and may not limit a sequence and/or an importance, or others, in relation to the constitutional elements. In some cases, a first constitutional element may be referred to as a second constitutional element, and similarly, a second constitutional element may be referred to as a first constitutional element without departing from the scope of right of the exemplary embodiments.

As used herein, the term "an embodiment" is provided to emphasize a particular feature, structure, or characteristic, and do not necessarily refer to the same embodiment. Furthermore, the particular characteristics or features may be combined in any suitable manner in one or more embodiments. For example, a context described in a specific exemplary embodiment may be used in other embodiments, even if it is not described in the other embodiments, unless it is described contrary to or inconsistent with the context in the other embodiments.

The terms used herein describe particular embodiments only, and the present disclosure is not limited thereby. As used herein, the singular forms "a," "an," and "the" are intended to include the plural forms as well, unless the context clearly indicates otherwise.

While exemplary embodiments have been shown and described above, it will be apparent to those skilled in the art that modifications and variations could be made without departing from the scope of the present invention as defined by the appended claims.

What is claimed is:

1. A printed circuit board, comprising:
a core layer;
a plurality of conductive pattern layers disposed on one side and the other side of the core layer;
a plurality of insulating layers disposed on the one side and the other side of the core layer;
a plurality of via layers disposed on the one side and the other side of the core layer; and
through vias penetrating through the core layer,
wherein the printed circuit board has a wiring region and a dummy region surrounding at least a portion outside of the wiring region on a plane,
wherein a metal ratio in the dummy region on the one side and a metal ratio in the dummy region on the other side are different from each other,
wherein the through vias are spaced apart from the dummy region,
wherein the plurality of conductive pattern layers disposed on the one side of the core layer comprise a first wiring pattern disposed in the wiring region, respectively,
wherein one or more of the plurality of conductive pattern layers disposed on the one side of the core layer comprise a first dummy pattern disposed in the dummy region, respectively,
wherein the plurality of conductive pattern layers disposed on the other side of the core layer comprise a second wiring pattern disposed in the wiring region, respectively,
wherein one or more of the plurality of conductive pattern layers disposed on the other side of the core layer comprise a second dummy pattern disposed in the dummy region, respectively,
wherein the metal ratio in the dummy region on the one side by a metal included in the first dummy pattern and the metal ratio in the dummy region on the other side by a metal included in the second dummy pattern are different from each other, and
wherein the number of the first dummy pattern included in any one of pattern layers disposed on the one side of the core layer and disposed on the same level as each other, and the number of the second dummy pattern included in any one of pattern layers disposed on the other side of the core layer and disposed on the same level as each other, are different from each other.

2. The printed circuit board of claim 1, wherein the total number of the first dummy pattern and the total number of the second dummy pattern are different from each other.

3. The printed circuit board of claim 1, wherein the number of layers of conductive pattern layers including the first dummy pattern and the number of layers of conductive pattern layers including the second dummy pattern are different from each other.

4. The printed circuit board of claim 1, wherein the first and second wiring patterns comprise a signal pattern, respectively, and the signal pattern of each of the first and second wiring patterns is electrically insulated from the first and second dummy patterns.

5. The printed circuit board of claim 1, wherein a wiring via is further disposed in the wiring region, and a dummy via is further disposed in the dummy region.

6. The printed circuit board of claim 5, wherein the plurality of via layers disposed on the one side of the core layer comprise a first wiring via disposed in the wiring region, respectively, one or more of the plurality of via layers disposed on the one side of the core layer comprise a first dummy via disposed in the dummy region, respectively, the plurality of via layers disposed on the other side of the core layer comprise a second wiring via disposed in the wiring region, respectively, and one or more of the plurality of via layers disposed on the other side of the core layer comprise a second dummy via disposed in the dummy region, respectively.

7. The printed circuit board of claim 6, wherein the metal ratio in the dummy region on the one side by a metal included in the first dummy via and the metal ratio in the dummy region on the other side by a metal included in the second dummy via are different from each other.

8. The printed circuit board of claim 7, wherein the total number of the first dummy via and the total number of the second dummy via are different from each other.

9. The printed circuit board of claim 7, wherein the number of the first dummy via included in any one of the via layers disposed on the one side of the core layer and disposed on the same level as each other and the number of the second dummy via included in any one of the via layers disposed on the other side of the core layer and disposed on the same level as each other are different from each other.

10. The printed circuit board of claim 7, wherein the number of layers of the via layer including the first dummy via and the number of layers of the via layer including the second dummy via are different from each other.

11. The printed circuit board of claim 1, wherein the core layer has a thickness, thicker than each of the insulating layers.

12. The printed circuit board of claim 1, further comprising:
a first passivation layer disposed on the plurality of insulating layers disposed on the one side of the core layer and having a first opening;
a second passivation layer disposed on the plurality of insulating layers disposed on the other side of the core layer and having a second opening; and
first and second electrical connection metals disposed on the first and second openings, respectively.

13. The printed circuit board of claim 1,
the plurality of conductive pattern layers include dummy patterns disposed in the dummy region and exposed from a side surface of the printed circuit board.

14. The printed circuit board of claim 13, wherein the plurality of conductive pattern layers comprise a signal pattern electrically insulated from the dummy patterns.

15. The printed circuit board of claim 13, wherein the dummy patterns are electrically insulated from patterns of the plurality of conductive pattern layers disposed in the wiring region.

16. A printed circuit board, comprising:
a core layer;
a plurality of conductive pattern layers disposed on one side and the other side of the core layer;
a plurality of insulating layers disposed on the one side and the other side of the core layer; and
a plurality of via layers disposed on the one side and the other side of the core layer,
wherein the printed circuit board has a wiring region and a dummy region surrounding at least a portion outside of the wiring region on a plane,
wherein a metal ratio in the dummy region on the one side and a metal ratio in the dummy region on the other side are different from each other, wherein the plurality of conductive pattern layers disposed on the one side of the core layer comprise a first wiring pattern disposed in the wiring region, respectively, wherein one or more of the plurality of conductive pattern layers disposed on the one side of the core layer comprise a first dummy pattern disposed in the dummy region, respectively, wherein the plurality of conductive pattern layers disposed on the other side of the core layer comprise a second wiring pattern disposed in the wiring region, respectively, wherein one or more of the plurality of conductive pattern layers disposed on the other side of the core layer comprise a second dummy pattern disposed in the dummy region, respectively, wherein the metal ratio in the dummy region on the one side by a metal included in the first dummy pattern and the metal ratio in the dummy region on the other side by a metal included in the second dummy pattern are different from each other, and wherein the number of the first dummy pattern included in any one of pattern layers disposed on the one side of the core layer and disposed on the same level as each other, and the number of the second dummy pattern included in any one of pattern layers disposed on the other side of the core layer and disposed on the same level as each other, are different from each other.

17. A printed circuit board, comprising:
a core layer;
a plurality of conductive pattern layers disposed on one side and the other side of the core layer;
a plurality of insulating layers disposed on the one side and the other side of the core layer; and
a plurality of via layers disposed on the one side and the other side of the core layer,
wherein the printed circuit board has a wiring region and a dummy region surrounding at least a portion outside of the wiring region on a plane,
wherein a metal ratio in the dummy region on the one side and a metal ratio in the dummy region on the other side are different from each other,
wherein a wiring via is further disposed in the wiring region, and a dummy via is further disposed in the dummy region,
wherein the plurality of via layers disposed on the one side of the core layer comprise a first wiring via disposed in the wiring region, respectively,
wherein one or more of the plurality of via layers disposed on the one side of the core layer comprise a first dummy via disposed in the dummy region, respectively,
wherein the plurality of via layers disposed on the other side of the core layer comprise a second wiring via disposed in the wiring region, respectively,
wherein one or more of the plurality of via layers disposed on the other side of the core layer comprise a second dummy via disposed in the dummy region, respectively,
wherein the metal ratio in the dummy region on the one side by a metal included in the first dummy via and the metal ratio in the dummy region on the other side by a metal included in the second dummy via are different from each other, and
wherein the number of the first dummy via included in any one of the via layers disposed on the one side of the core layer and disposed on the same level as each other and the number of the second dummy via included in any one of the via layers disposed on the other side of the core layer and disposed on the same level as each other are different from each other.

\* \* \* \* \*